(12) United States Patent
Oe et al.

(10) Patent No.: US 12,384,151 B2
(45) Date of Patent: Aug. 12, 2025

(54) HEAD UNIT AND LIQUID EJECTING APPARATUS

(71) Applicant: SEIKO EPSON CORPORATION, Tokyo (JP)

(72) Inventors: Kenichi Oe, Matsumoto (JP); Kazuya Tajima, Shiojiri (JP); Atsushi Soma, Matsumoto (JP)

(73) Assignee: SEIKO EPSON CORPORATION (JP)

(*) Notice: Subject to any disclaimer, the term of this patent is extended or adjusted under 35 U.S.C. 154(b) by 154 days.

(21) Appl. No.: 18/503,383

(22) Filed: Nov. 7, 2023

(65) Prior Publication Data
US 2024/0149584 A1 May 9, 2024

(30) Foreign Application Priority Data
Nov. 8, 2022 (JP) .................. 2022-178664

(51) Int. Cl.
*B41J 2/14* (2006.01)
*H10N 30/20* (2023.01)
*H10N 30/80* (2023.01)
*H10N 30/87* (2023.01)

(52) U.S. Cl.
CPC ...... *B41J 2/14201* (2013.01); *H10N 30/2047* (2023.02); *H10N 30/802* (2023.02); *H10N 30/875* (2023.02)

(58) Field of Classification Search
CPC ............... B41J 2/14201; B41J 2/14274; B41J 2002/14491; B41J 2/14233; B41J 2002/14306; B41J 2002/14225; B41J 2/14282; B41J 2/1429; B41J 2/14298; H10N 30/2047; H10N 30/802; H10N 30/875
See application file for complete search history.

(56) References Cited

U.S. PATENT DOCUMENTS

| 10,730,303 | B2* | 8/2020 | Kuramoto | .............. B41J 2/1433 |
| 2013/0194352 | A1* | 8/2013 | Watanabe | ............ B41J 2/14233 |
| | | | | 347/71 |
| 2022/0348008 | A1* | 11/2022 | Okamoto | ............. B41J 2/04593 |

FOREIGN PATENT DOCUMENTS

| JP | 2004-095872 A | 3/2004 | |
| JP | 2009269315 | * 11/2009 | .............. B41J 2/045 |

* cited by examiner

*Primary Examiner* — Kristal Feggins
(74) *Attorney, Agent, or Firm* — Harness, Dickey & Pierce, P.L.C.

(57) ABSTRACT

A head unit to be mounted in a liquid ejecting apparatus includes: a liquid ejecting section; a first flexible substrate that transmits the electrical signal to a joining terminal of the piezoelectric element; and a second flexible substrate that transmits the electrical signal to the first flexible substrate. The second flexible substrate includes: a first region having a stack of the cover member, the conductive member, and the base member; and a second region having a stack of the conductive member and the base member. The second flexible substrate has a surface on which a terminal is disposed within the second region, the terminal being joined to the first flexible substrate with solder.

8 Claims, 7 Drawing Sheets

HEAD UNIT AND LIQUID EJECTING APPARATUS

The present application is based on, and claims priority from JP Application Serial Number 2022-178664, filed Nov. 8, 2022, the disclosure of which is hereby incorporated by reference herein in its entirety.

BACKGROUND

1. Technical Field

The present disclosure relates to a head unit and a liquid ejecting apparatus.

2. Related Art

Some known ink jet printers include a head unit in which a plurality of substrates are mounted with their terminals soldered together.

JP-A-2004-95872 discloses two substrates on which respective electronic components are mounted with their terminals soldered together. The electrical connection between these terminals is inspected by visually checking the electrical continuity therebetween.

In the related art, however, it is sometimes difficult to visually check whether the solder joint between the terminals of the substrates is normal.

SUMMARY

According to an aspect of the present disclosure, a head unit to be mounted in a liquid ejecting apparatus includes: a liquid ejecting section that includes a pressure chamber that stores ink, a plurality of nozzles that communicate with the pressure chamber, and a supply passage through which the ink is to be supplied to the pressure chamber; a piezoelectric element that varies a capacity of the pressure chamber in response to an electrical signal; a drive signal control circuit that selectively supplies the electrical signal to the piezoelectric element; a first flexible substrate that transmits the electrical signal to a joining terminal of the piezoelectric element; and a second flexible substrate that transmits the electrical signal to the first flexible substrate. The second flexible substrate has a cover member, a conductive member, and a base member. The second flexible substrate includes a first region and a second region, the first region having a stack of the cover member, the conductive member, and the base member, the second region having a stack of the conductive member and the base member. The second flexible substrate has a surface on which a terminal is disposed within the second region, the terminal being joined to the first flexible substrate with solder.

According to another aspect of the present disclosure, a liquid ejecting apparatus includes a transport mechanism and a head unit. The head unit includes: a liquid ejecting section that includes a pressure chamber that stores ink, a plurality of nozzles that communicate with the pressure chamber, and a supply passage through which the ink is to be supplied to the pressure chamber; a piezoelectric element that varies a capacity of the pressure chamber in response to an electrical signal; a drive signal control circuit that selectively supplies the electrical signal to the piezoelectric element; a first flexible substrate that transmits the electrical signal to a joining terminal of the piezoelectric element; and a second flexible substrate that transmits the electrical signal to the first flexible substrate. The second flexible substrate has a cover member, a conductive member, and a base member. The second flexible substrate includes a first region and a second region, the first region having a stack of the cover member, the conductive member, and the base member, the second region having a stack of the conductive member and the base member. The second flexible substrate has a surface on which a terminal is disposed within the second region, the terminal being joined to the first flexible substrate with solder.

DESCRIPTION OF EMBODIMENTS

Some embodiments will be described below with reference to the accompanying drawings.

Figure 1:
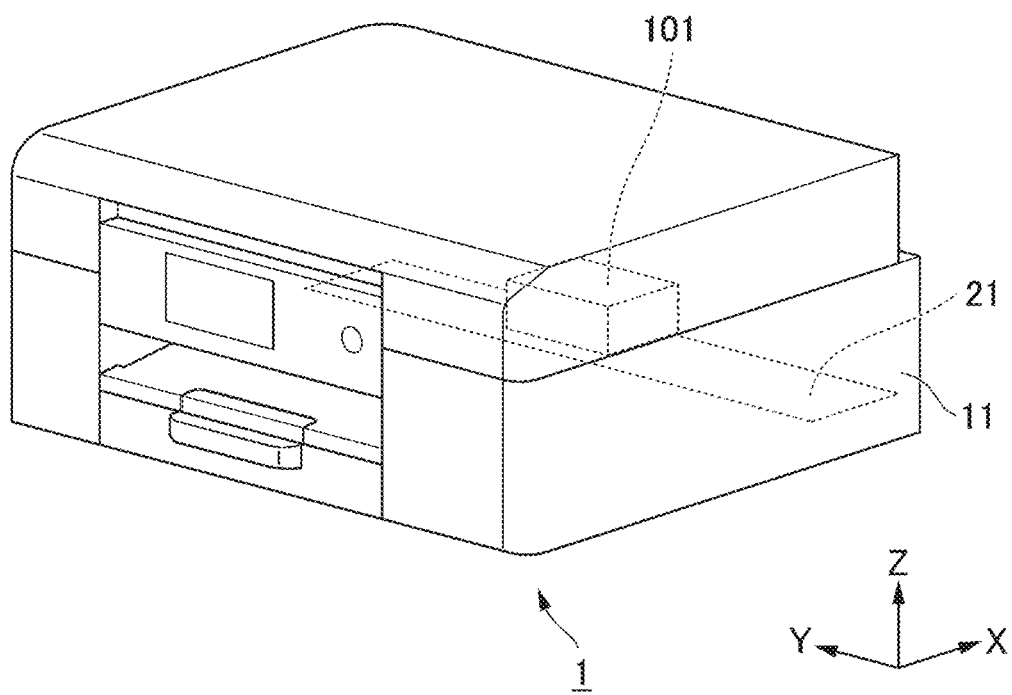
FIG. 1 is a schematic, perspective view of a configuration example of a printer according to an embodiment of the present disclosure.

FIG. 1 is a schematic, perspective view of a configuration example of a printer 1 according to an embodiment of the present disclosure. The printer 1 is an example of a liquid ejecting apparatus. The printer 1 includes a housing 11 in which a transport mechanism 21 and a head unit 101 are arranged. It should be noted that FIG. 1 illustrates only simplified configurations of the transport mechanism 21 and the head unit 101.

The transport mechanism 21 includes some transport rollers and a driver therefor and is configured to transport a medium such as a paper sheet on which letters, figures, or images are to be printed. The head unit 101 is configured to print letters, figures, or images on a medium being transported by the transport mechanism 21 with liquid such as ink.

Figure 2:
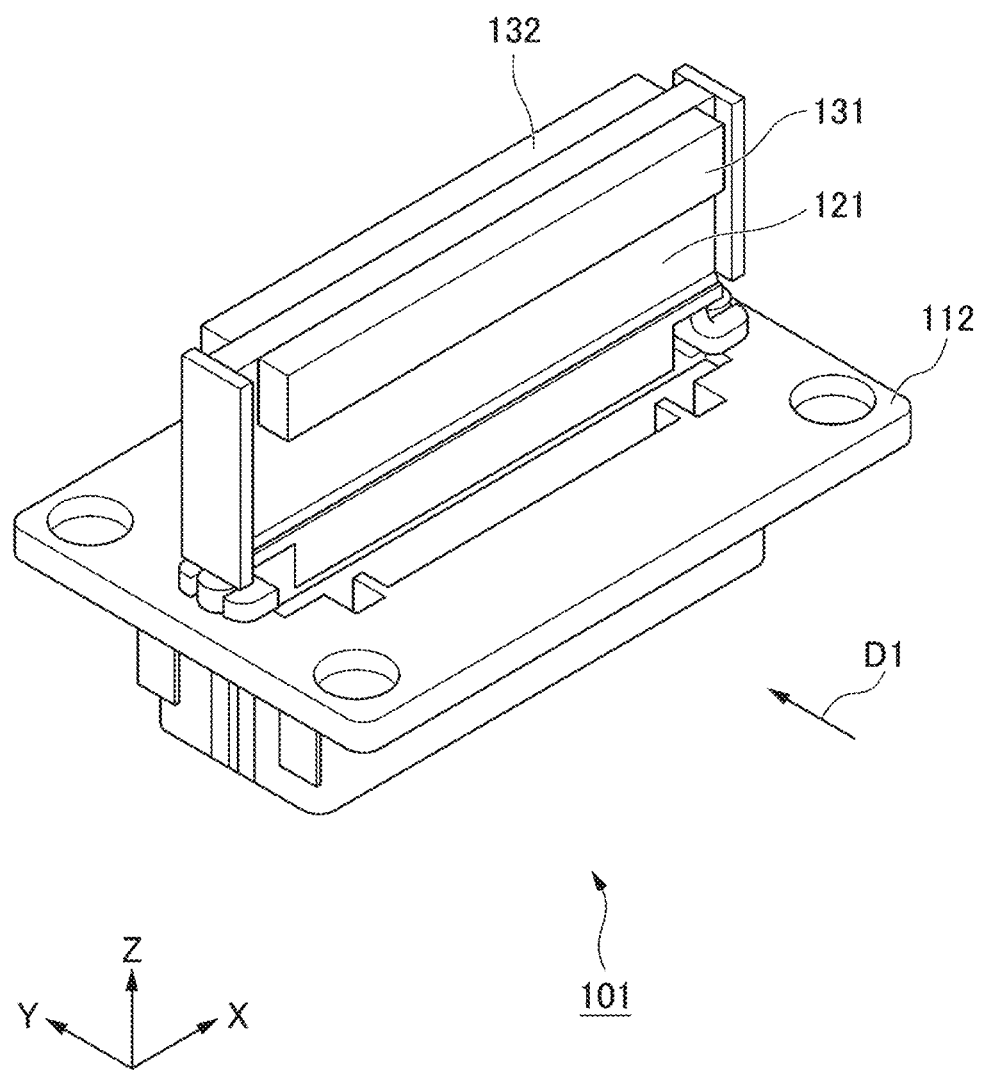
FIG. 2 is a schematic, perspective view of a configuration example of the head unit.

FIG. 2 is a schematic, perspective view of a configuration example of the head unit 101. It should be noted that FIG. 2 employs an X-Y-Z orthogonal coordinate system as a three-dimensional orthogonal coordinate system, for the sake of convenience.

Although FIG. 2 illustrates an example of the exterior of the head unit 101, a detailed description of the head unit 101 will be given with reference to FIG. 3 and some other subsequent drawings.

Figure 3:
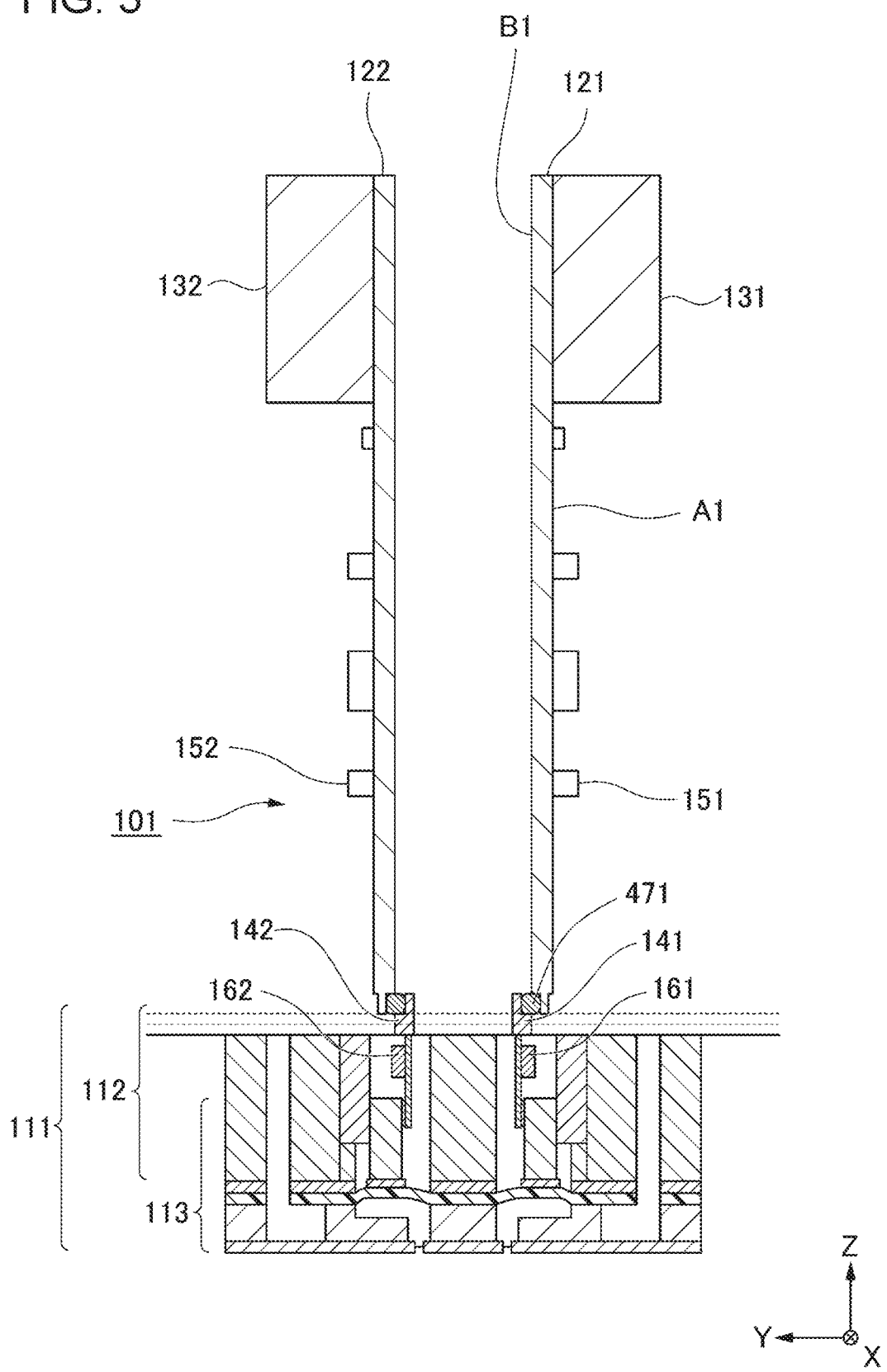
FIG. 3 is a schematic sectional view of a configuration example of the head unit.

FIG. 3 is a schematic sectional view of a configuration example of the head unit 101. It should be noted that FIG. 3 employs an X-Y-Z orthogonal coordinate system as in FIG. 2, for the sake of convenience. In the following description, the positive side along the Z-axis is defined as the upper side, whereas the negative side along the Z-axis is defined as the lower side.

The head unit 101 includes: a pedestal section 111; a first flexible printed circuits (FPC) substrate 121; a first connector 131 by which the first FPC substrate 121 is to be joined to a first driver circuit; a first chip on film (CoF) substrate 141; a first component 151; a first drive signal control circuit 161; a second FPC substrate 122; a second connector 132 by which the second FPC substrate 122 is to be joined to a second driver circuit; a second CoF substrate 142; a second component 152; and a second drive signal control circuit 162. The pedestal section 111 includes a case head 112 and a liquid ejecting section 113. It should be noted that FIG. 3 illustrates only the simplified internal structure of the pedestal section 111 and gives no reference numerals to components inside the pedestal section 111.

The first FPC substrate 121 may be a flexible interconnection substrate and may also be referred to as the flexible substrate. Likewise, the first CoF substrate 141 may be a flexible interconnection substrate and may also be referred to as the flexible substrate. In this case, the first CoF substrate 141 includes: a wiring circuit substrate made of a polyimide film; and a semiconductor chip mounted on the wiring circuit substrate. The configuration of the first CoF substrate 141 is different from that of the first FPC substrate 121 which includes a wiring circuit substrate made of a polyimide film. Each of the first drive signal control circuit 161 and the second drive signal control circuit 162 may include a transfer gate.

In this embodiment, the first FPC substrate 121, the first connector 131, the first CoF substrate 141, the first component 151, and the first drive signal control circuit 161 are arranged symmetrically to, respectively, the second FPC substrate 122, the second connector 132, the second CoF substrate 142, the second component 152, and the second drive signal control circuit 162 with respect to a predetermined plane parallel to the X-Z plane. Thus, detailed configurations of the first FPC substrate 121, the first connector 131, the first CoF substrate 141, the first component 151, and the first drive signal control circuit 161 will be described, and those of the second FPC substrate 122, the second connector 132, the second CoF substrate 142, the second component 152, and the second drive signal control circuit 162 will not be described.

The pedestal section 111 has an upper surface substantially parallel to the X-Y plane. The first FPC substrate 121 is disposed with its surfaces extending substantially vertically to the upper surface of the pedestal section 111, namely, substantially parallel to the X-Z plane.

The first FPC substrate 121 has a first mounting surface A1 and a first CoF bonded surface B1. The first mounting surface A1 faces toward the negative side of the Y-axis, whereas the first CoF bonded surface B1 faces toward the positive side of the Y-axis. In this embodiment, of the first FPC substrate 121, the first mounting surface A1 is defined as a rear surface, and the first CoF bonded surface B1 is defined as a front surface, for the sake of convenience. However, the front surface and the rear surface may be defined inversely.

The first FPC substrate 121 is provided with the first connector 131 in an upper portion on the first mounting surface A1. The first connector 131 is mounted on the first mounting surface A1.

The first FPC substrate 121 is provided with the first component 151 below the first connector 131 on the first mounting surface A1. In the example of FIG. 3, a plurality of components are mounted on the first mounting surface A1, but the reference numeral is assigned only to the first component 151.

The first CoF substrate 141 is disposed with its surfaces extending substantially vertical to the upper surface of the pedestal section 111, namely, substantially parallel to the X-Z plane. The surfaces of the first CoF substrate 141 are substantially parallel to those of the first FPC substrate 121.

The first CoF substrate 141 is provided with the first drive signal control circuit 161 on its one surface. The surface on which the first drive signal control circuit 161 is mounted may face toward the negative side of the Y-axis.

The first CoF bonded surface B1 of the first FPC substrate 121 is joined to a predetermined surface of the first CoF substrate 141 with first solder 471. This predetermined surface faces toward the negative side of the Y-axis and opposes the first CoF bonded surface B1 of the first FPC substrate 121.

Figure 4:
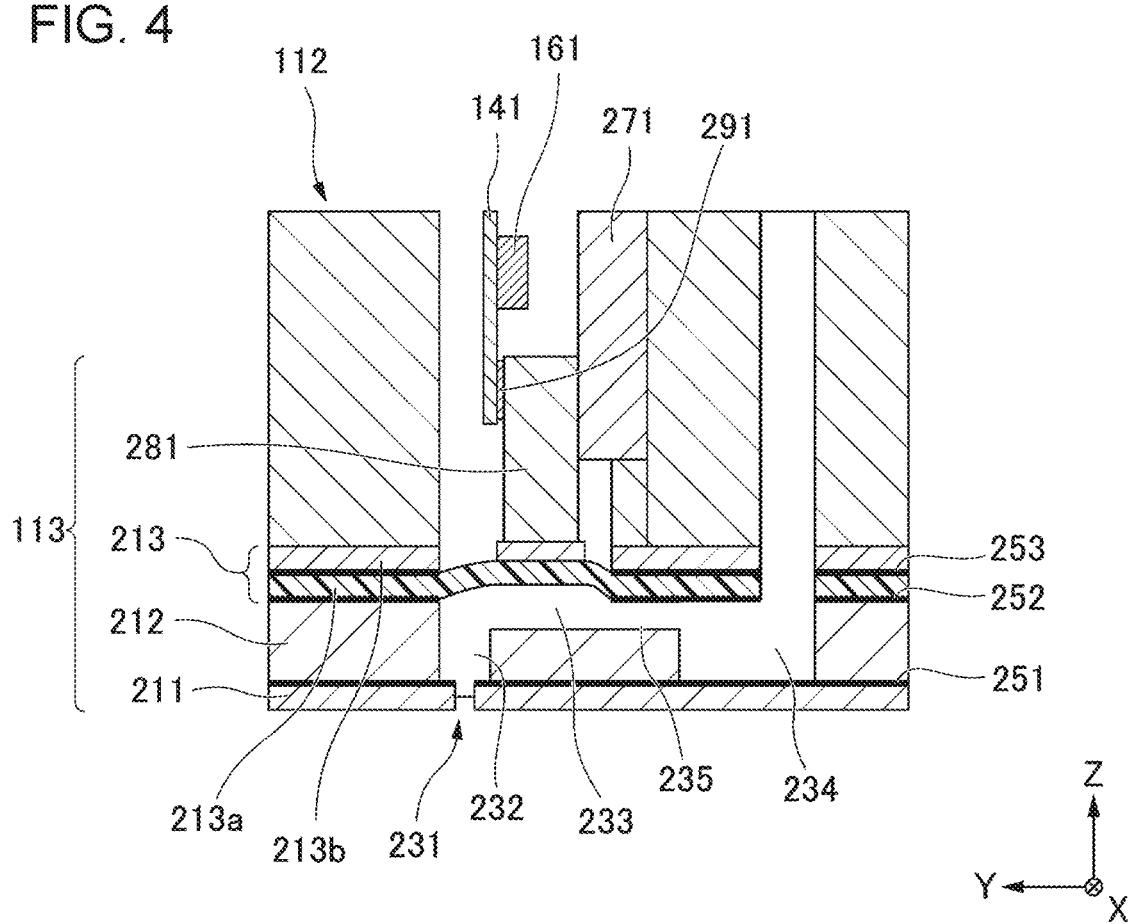
FIG. 4 is a detailed sectional view of a configuration example of the pedestal section in the head unit.

FIG. 4 is a detailed sectional view of a configuration example of the pedestal section 111 in the head unit 101. It should be noted that FIG. 4 employs an X-Y-Z orthogonal coordinate system as in FIG. 2, for the sake of convenience. Further, FIG. 4 illustrates the configuration example of the pedestal section 111 on the first FPC substrate 121 side.

The pedestal section 111 includes a nozzle plate 211, a silicon cavity 212, a vibration plate 213 having a sheet shape, and the case head 112 in this order from the bottom. The nozzle plate 211 has a plurality of nozzles 231. The nozzle plate 211 is joined to the silicon cavity 212 with a first adhesive section 251 therebetween, the first adhesive section 251 being made of an adhesive agent. The silicon cavity 212 is joined to the vibration plate 213 with a second adhesive section 252 therebetween, the second adhesive section 252 being made of an adhesive agent. The vibration plate 213 is joined to the case head 112 with a third adhesive section 253 therebetween, the third adhesive section 253 being made of an adhesive agent.

The vibration plate 213 includes: an elastic member 213a formed of an elastic film; and a support member 213b formed of a support plate. The elastic member 213a is bonded to the surface of a passage substrate, whereas the support member 213b is stacked on the elastic member 213a. The elastic member 213a may be made of para-aramid resin, whereas the support member 213b may be made of stainless steel. The support member 213b is partly removed so that an island-shaped section that covers a pressure chamber 233 is formed. Because of the removal of the support member 213b, the portion of the vibration plate 213 which covers a supply passage 235 is formed of the elastic member 213a alone. The silicon cavity 212 includes: a communication port 232 disposed above the nozzles 231; a pressure chamber 233 that communicates with the communication port 232; a reservoir 234 disposed separately and apart from both the communication port 232 and the pressure chamber 233; and the supply passage 235 via which the reservoir 234 is coupled to the pressure chamber 233.

The case head 112 has a recess above the pressure chamber 233. The recess in the case head 112 contains a stationary plate 271 and a piezoelectric element 281 fixed to the stationary plate 271. The piezoelectric element 281 may utilize a piezoelectric effect. The lower surface of the piezoelectric element 281 is joined to the upper surface of the vibration plate 213 with an adhesive agent. This adhesive agent may be either the same as or different from that used to form the third adhesive section 253.

An upper portion of one surface of the piezoelectric element 281 is joined to a lower portion of the opposing surface of the first CoF substrate 141 with solder 291. The surface of the first CoF substrate 141 to which the piezoelectric element 281 is joined faces toward the negative side of the Y-axis.

Figure 5:
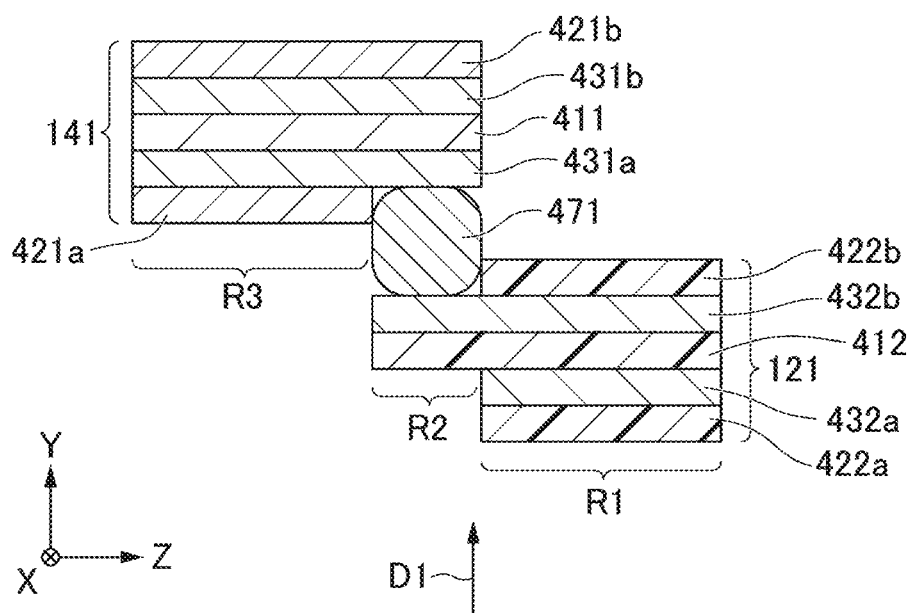
FIG. 5 is a detailed sectional view of the first FPC substrate and the first CoF substrate, the terminals of which are soldered together.

FIG. 5 is a detailed sectional view of the first FPC substrate 121 and the first CoF substrate 141, the respective terminals of which are soldered together. It should be noted that in the example of FIG. 5, the size of the first solder 471 and the distance between the first FPC substrate 121 and the first CoF substrate 141 may be different from real ones, for the purpose of clearly illustrating the solder joint. In addition, FIG. 5 employs an X-Y-Z orthogonal coordinate system as in FIG. 2, for the sake of convenience. Further, FIG. 5 illustrates the configuration example of portions of the first FPC substrate 121 and the first CoF substrate 141 which extends in the Z-axial direction.

The first CoF substrate 141 includes: a first base member 411; and some conductive members and cover members stacked on the first base member 411 in a direction vertical to the surfaces of the first CoF substrate 141. More specifically, a first (a) conductive member 431a and a first (a) cover member 421a are stacked, in this order from above, on one of both surfaces of the first base member 411 which is closer to the first FPC substrate 121. In addition, a first (b) conductive member 431b and a first (b) cover member 421b are stacked, in this order from below, on the remaining surface of the first base member 411.

The first FPC substrate 121 includes: a second base member 412; and some conductive members and cover members stacked on the second base member 412 in a direction vertical to the surfaces of the first FPC substrate 121. More specifically, a second (a) conductive member 432a and a second (a) cover member 422a are stacked, in this order from above, on one of both surfaces of the second base member 412 which is farther from the first CoF substrate 141. In addition, a second (b) conductive member 432b and a second (b) cover member 422b are stacked, in this order from below, on the remaining surface of the second base member 412.

Each of the first (a) conductive member 431a and the first (b) conductive member 431b in the first CoF substrate 141 may be made of a copper foil; however, it may be made of any other conductive material. Likewise, each of the second (a) conductive member 432a and the second (b) conductive member 432b in the first FPC substrate 121 may be made of a copper foil; however, it may be made of any other conductive material. Each of the first (a) cover member 421a, the first (b) cover member 421b, the second (a) cover member 422a, and the second (b) cover member 422b may also be referred to as the cover layer.

As illustrated in FIG. 5, the first FPC substrate 121 has a first region R1 and a second region R2 arranged in a direction parallel to the Z-axis, which is parallel to the surfaces of the first FPC substrate 121. The second region R2 corresponds to an area in which the first FPC substrate 121 is joined to the first CoF substrate 141 with the first solder 471. The first region R1 corresponds to an area in which the first FPC substrate 121 is not joined to the first CoF substrate 141 with the first solder 471.

The first FPC substrate 121 includes, within the first region R1, the stack of the second (a) cover member 422a, the second (a) conductive member 432a, the second base member 412, the second (b) conductive member 432b, and the second (b) cover member 422b. Moreover, the first FPC substrate 121 includes, within the second region R2, the stack of the second base member 412 and the second (b) conductive member 432b.

As illustrated in FIG. 5, the first CoF substrate 141 has the second region R2 and a third region R3 arranged in a direction parallel to the Z-axis, which is parallel to the surfaces of the first CoF substrate 141. Within the second region R2, the first FPC substrate 121 overlaps the first CoF substrate 141 as viewed from a direction parallel to the Y-axis. The third region R3 corresponds to an area in which the first FPC substrate 121 is not joined to the first CoF substrate 141 with the first solder 471.

In the first CoF substrate 141, the first (a) cover member 421a, the first (a) conductive member 431a, the first base member 411, the first (b) conductive member 431b, and the first (b) cover member 421b are stacked on top of one another within the third region R3. Likewise, in the first CoF substrate 141, the first (a) conductive member 431a, the first base member 411, the first (b) conductive member 431b, and the first (b) cover member 421b are stacked on top of one another within the second region R2.

In the example of FIG. 5, within the second region R2, the second (b) conductive member 432b in the first FPC substrate 121 is joined to the first (a) conductive member 431a in the first CoF substrate 141 with the first solder 471. In this way, the conductive patterns are soldered together. In this joint, the second (b) conductive member 432b in the first FPC substrate 121 corresponds to terminals in the first FPC substrate 121, whereas the first (a) conductive member 431a in the first CoF substrate 141 corresponds to terminals in the first CoF substrate 141.

It should be noted that in the example of FIG. 5, both the second (a) cover member 422a and the second (a) conductive member 432a of the first FPC substrate 121 are absent within the second region R2. It is thus possible to easily understand how the conductive members are joined together with the first solder 471, as viewed from a first direction D1, namely, the direction from the rear to the front of the first FPC substrate 121.

Some examples of materials and numeric values in the first FPC substrate 121 and the second FPC substrate 122 will be described below. The material of each of the first FPC substrate 121 and the second FPC substrate 122 may be formed with electrolyte copper (Cu) and polyimide (PI). The thickness of the electrolyte Cu may be approximately 12 µm; the thickness of the PI may be approximately 20 µm; and the thickness of the Cu plating is approximately 6 µm. Each cover layer may be formed with PI and an adhesive agent (Ad). The photoresist may be a green one. The surface treatment may be a process using electroless Ni/Au. In this case, Ni may be 3 to 9; Au may be 0.03 to 0.09. A reinforcement plate does not necessarily have to be disposed in this case.

The configuration of each of the first FPC substrate 121 and the second FPC substrate 122 is an example and is not limited to the above aspect accordingly. Each of the first CoF substrate 141 and the second CoF substrate 142 may employ substantially the same materials and numeric values as in the first FPC substrate 121 and the second FPC substrate 122.

The first CoF substrate 141, the second CoF substrate 142, the first FPC substrate 121, and the second FPC substrate 122 may conform to either the same or different specifications.

In this embodiment, each of the second base member 412, the second (a) cover member 422a, and the second (b) cover member 422b of the first FPC substrate 121 may be a semitransparent member made of polyimide. In this embodiment, each of the second (a) conductive member 432a and the second (b) conductive member 432b of the first FPC substrate 121 may be an opaque member. Within the second region R2, no conductive members are stacked over the second (b) conductive member 432b to be observed. In addition, the layer formed of the opaque member is thinner because of the absence of on the second (a) cover member 422a. Therefore, the second region R2 can be visually checked more easily than the first region R1.

In the example of FIG. 5, within the second region R2 of the first FPC substrate 121, the missing length of the second (a) cover member 422a is substantially the same as that of the second (b) cover member 422b in a direction parallel to the Z-axis. As an alternative example, however, the missing length of the second (b) cover member 422b may be somewhat greater than that of the second (a) cover member 422a. In this case, the difference in length may be approximately 0.2 mm. Setting the length difference in this manner can reduce the risk of the second (b) conductive member 432b being damaged due to stress. This is because the edge of the second (a) cover member 422a is misaligned from the corresponding edge of the second (b) cover member 422b within the second region R2 as viewed from a direction parallel to the Y-axis direction.

Figure 6:
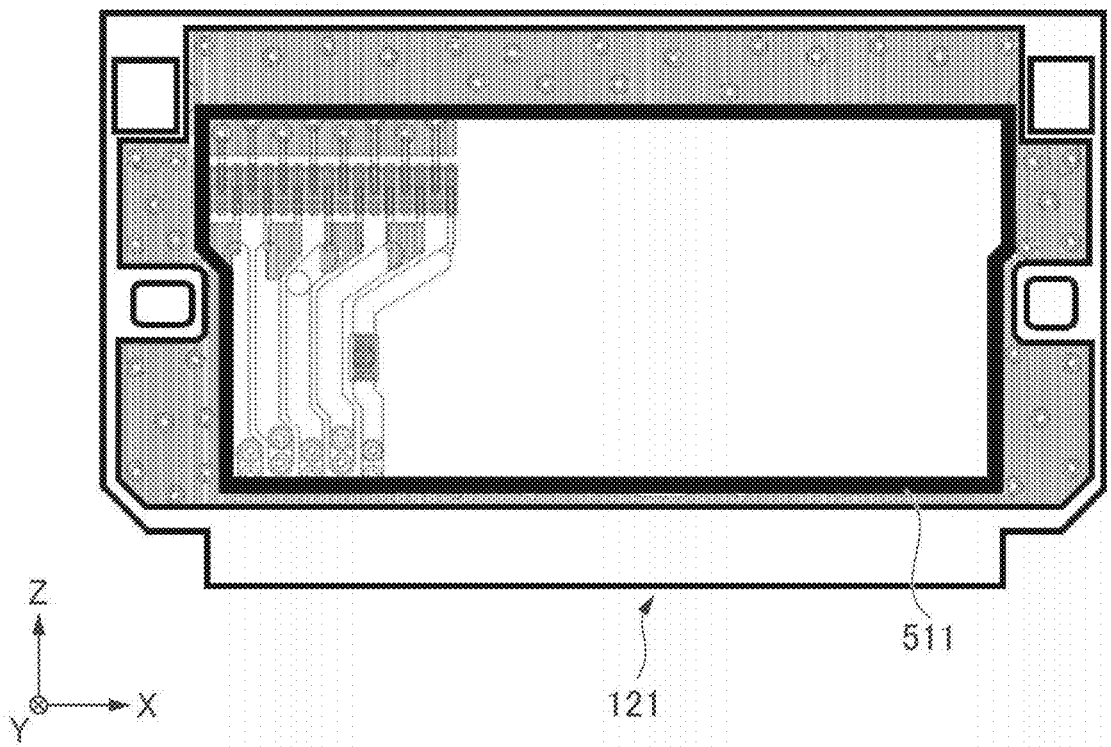
FIG. 6 illustrates an example of a first solid GND on the first FPC substrate.

FIG. 6 illustrates an example of a border 511 of a first solid GND on the rear surface of the first FPC substrate 121. As illustrated in FIG. 6, another GND is formed outside the border 511 of the first solid GND, namely, on the periphery of the rear surface of the first FPC substrate 121. It should be noted that FIG. 6 employs an X-Y-Z orthogonal coordinate system as in FIG. 2, for the sake of convenience. In addition, the solid GND may be referred to as the solid ground.

FIG. 6 illustrates detailed wiring in a portion of the first solid GND inside the border 511 on the rear surface of the first FPC substrate 121 but illustrates no wiring in the remaining portion of the first solid GND. In this embodiment, to reduce noise, the GND is formed on the periphery of the rear surface of the first FPC substrate 121, namely, outside the border 511 of the first solid GND. In addition, the border 511 of the first solid GND is defined on the rear surface of the first FPC substrate 121 so that some conductive members can be mounted and protected around the area containing the center of the rear surface. It should be noted that the GND may be referred to as the ground.

Figure 7A:
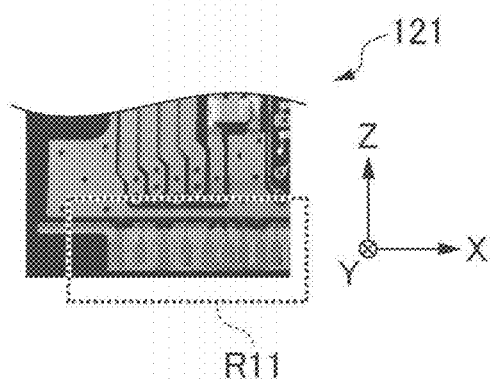
FIG. 7A illustrates an example of the rear surface of the first FPC substrate.

FIG. 7A illustrates an example of the rear surface of the first FPC substrate 121. It should be noted that FIG. 7A employs an X-Y-Z orthogonal coordinate system as in FIG. 2, for the sake of convenience.

As illustrated in FIG. 7A, none of a terminal CND and cover layers is formed within a first partial region R11, which is a partial area on the rear surface of the first FPC substrate 121. In the example of FIG. 7A, the terminal GND corresponds to the second (a) conductive member 432a, whereas the cover layers correspond to the second (a) cover member 422a and the second (b) cover member 422b. With this configuration, a user can clearly view the terminals of the first FPC substrate 121 within the first partial region R11 from the rear side. Consequently, it is possible to visually check the solder joint between the terminals of the first FPC substrate 121 and the first CoF substrate 141.

Figure 7B:
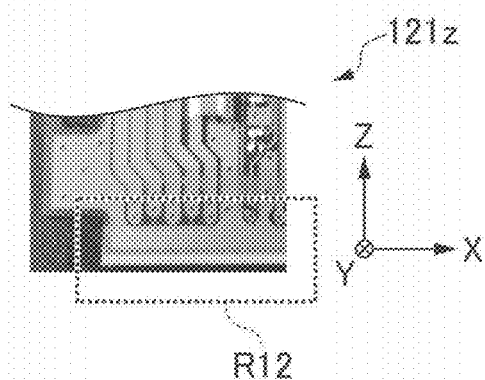
FIG. 7B illustrates an example of the rear surface of a first FPC substrate according to a comparative example.

FIG. 7B illustrates an example of the rear surface of a first (z) FPC substrate 121z according to a comparative example. FIG. 7B employs an X-Y-Z orthogonal coordinate system as in FIG. 2, for the sake of convenience.

As illustrated in FIG. 7B, a terminal CND and cover layers are formed within a second partial region R12, which is a partial area on the rear surface of the first (z) FPC substrate 121z. Because of this configuration, a user cannot clearly view the terminals of the first (z) FPC substrate 121z within the second partial region R12 from the rear side. Consequently, it is difficult to visually check the solder joint between the terminals of the first (z) FPC substrate 121z and a first CoF substrate 141.

As described above, a head unit includes: an FPC substrate having terminals to be soldered to a CoF substrate; and the CoF substrate having terminals to be soldered to the FPC substrate. The head unit is configured such that the terminals of the FPC substrate and the CoF substrate are soldered together while the terminals are facing each other. In a head unit according to a comparative example, a user has difficulty visually checking the terminals of a FPC substrate from either the front or rear surface after the terminals have been soldered.

The head unit according to this embodiment enables a user to, after the terminals of the FPC substrate and the CoF substrate have been soldered together, visually check whether the solder joints between the terminals are normal, such as whether the wettability of the solder at the joints is normal or whether the solder bridges between adjacent joints. More specifically, in the head unit according to this embodiment, a solid GND is formed on the periphery of the rear surface of the FPC substrate for the purpose of reducing noise, but no solid GND is formed over the terminals. Furthermore, no cover layers are formed over the terminals for the purpose of decreasing the thickness and thus improving the visibility of the terminals. This configuration can facilitate the inspection of the terminals of the FPC substrate. For example, a user can visually check the solder joints between the terminals after the terminals have been soldered, thereby visually confirming whether the solder sufficiently expands to appropriately join the terminals and whether the solder excessively expands to bridge adjacent terminals.

In this embodiment, as described above, when the terminals of the FPC substrate and the CoF substrate are soldered together, none of a solid GND and cover layers is formed over the terminals of the FPC substrate. In this case, a solid GND corresponds to one formed on one of the surfaces of the FPC substrate which is closer to the user when a user visually checks the solder joint between the terminals.

In a head unit 101 according to this embodiment, as described above, no conductive members are formed within an area on one surface of the first FPC substrate 121 behind the terminals on the other surface which are soldered to those of a first CoF substrate 141. The layer formed of the opaque member is thinner because of the absence of the cover member. With this configuration, the inspector can visually check the above area. More specifically, neither a second (a) cover member 422a nor a second (a) conductive member 432a is formed on the area on the rear surface of the first FPC substrate 121. With this configuration, a user can clearly view the wettability of the solder joints present between the first FPC substrate 121 and the first CoF substrate 141. Consequently, it is possible to easily visually check the solder joints between the terminals of the first FPC substrate 121 and the first CoF substrate 141. By joining the terminals together with solder, the terminals are electrically coupled to each other.

If reactive ink is used in the head unit 101, which serves as a head of a printer, solder joints are demanded because it is possible to reduce disadvantages that may arise due to adhering of the ink. In short, if reactive ink is used, a technique using solder joints is suitable. In such cases, the configuration in this embodiment is effective.

With a growing demand for high-definition images in recent years, for example, head units are arranged at a higher density. As a specific example, head units tend to have an increasing number of nozzles and consume increasing amounts of current accordingly. In addition, terminals via which signals are to be transmitted to a head unit tend to be arranged at an increasing density. As a result, some terminals are more likely to short when soldered. In such cases, the configuration in this embodiment is also effective.

The first FPC substrate 121 and the first CoF substrate 141 may be double-sided wiring substrates. In this case, by forming a solid GND in each of the first FPC substrate 121 and the first CoF substrate 141 as in this embodiment, their electromagnetic compatibility (EMC) level can be enhanced.

As a configuration example, a head unit 101 to be mounted in a liquid ejecting apparatus includes: a liquid ejecting section 113 that includes a pressure chamber 233 that stores ink, a plurality of nozzles 231 that communicate with the pressure chamber 233, and a supply passage 235 through which the ink is to be supplied to the pressure chamber 233; a piezoelectric element 281 that varies a capacity of the pressure chamber 233 in response to an electrical signal; a drive signal control circuit that selectively supplies the electrical signal to the piezoelectric element 281; a first flexible substrate that transmits the electrical signal to a joining terminal of the piezoelectric element 281; and a second flexible substrate that transmits the electrical signal to the first flexible substrate. The second flexible substrate has a cover member, a conductive member, and a base member and includes a first region R1 and a second region R2, the first region R1 including a stack of the cover member, the conductive member, and the base member, the second region R2 including a stack of the conductive member and the base member. The second flexible substrate has a surface on which a terminal is disposed within the second region R2, the terminal being joined to the first flexible substrate with solder.

In the examples of FIGS. 1 to 7B, the printer 1 corresponds to an example of the liquid ejecting apparatus. In the examples of FIGS. 1 to 7B, the first CoF substrate 141 corresponds to an example of the first flexible substrate. In the examples of FIGS. 1 to 7B, the first FPC substrate 121 corresponds to an example of the second flexible substrate. In the examples of FIGS. 1 to 7B, the first drive signal control circuit 161 corresponds to an example of the drive signal control circuit. In the example of FIG. 5, the second (a) cover member 422a, the second (a) conductive member 432a, and the second base member 412 within the first region R1 on the surface, to be viewed by a user, of the first FPC substrate 121 corresponds, respectively, to examples of the cover member, the conductive member, and the base member within the first region. In the example of FIG. 5, the second base member 412 within the second region R2 on the surface, to be viewed by the user, of the first FPC substrate 121 corresponds to an example of the base member.

As a configuration example of the head unit 101, no other conductive members are disposed within the second region R2 on the upper surface of a conductive member to be soldered. In the example of FIG. 5, the first solder 471 is an example of solder. In the example of FIG. 5, the second (b) conductive member 432b corresponds to an example of the conductive member to be soldered. In the example of FIG. 5, a surface opposite to a surface that is to be viewed from the first direction D1, namely, that is pointed by the arrow of the first direction D1 corresponds to an example of the upper surface.

As a configuration example, the first flexible substrate and the second flexible substrate in the head unit 101 are double-sided wiring substrates. In the examples of FIGS. 1 to 7B, the first flexible substrate and the second flexible substrate are double-sided wiring substrates. As an alternative example, however, the first flexible substrate and the second flexible substrate are single-sided wiring substrates.

As a configuration example, the head unit 101 uses reactive ink as ink. However, the ink is not limited to the reactive ink.

As a configuration example, the head unit 101 includes a plurality of nozzles arranged at a high density. However, the density of the nozzles arranged is not limited to specific value.

As a configuration example, the liquid ejecting apparatus includes the head unit 101 and a transport mechanism 21.

Figure 8A:
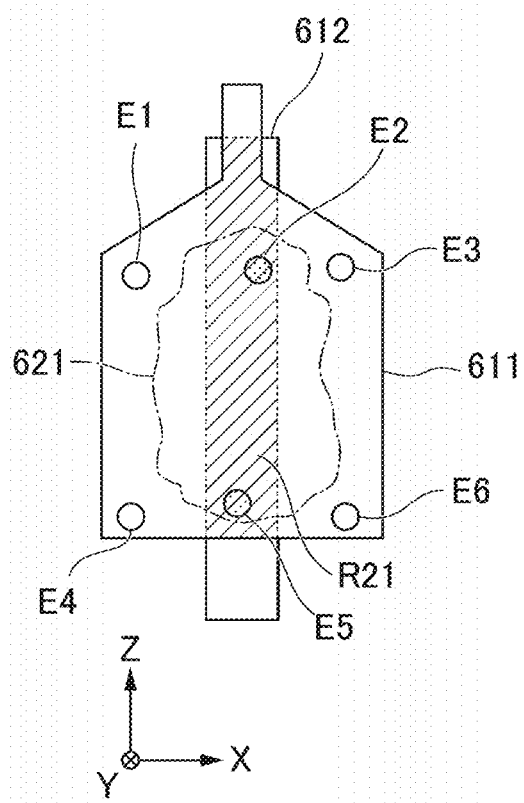
FIG. 8A illustrates an example of a good solder joint between a first FPC terminal and a first CoF terminal according to a modification of the embodiment.
Figure 8B:
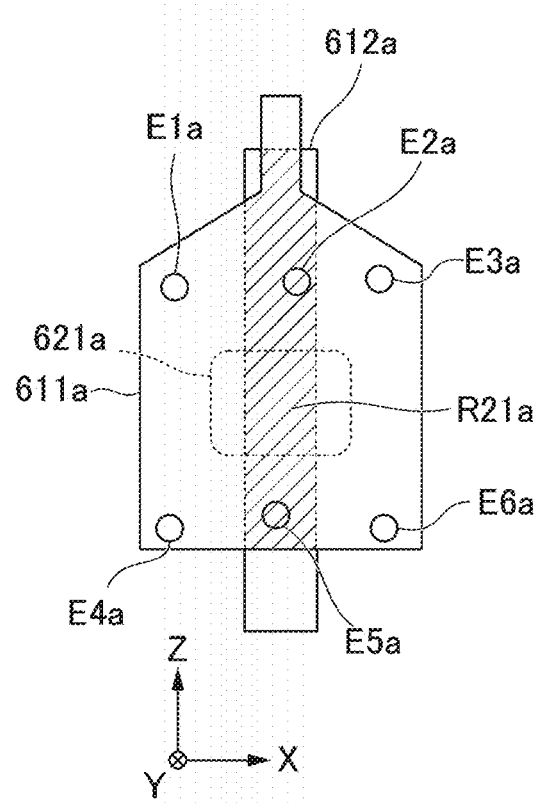
FIG. 8B illustrates an example of a poor solder joint between a first (a) FPC terminal and a first (a) CoF terminal according to a comparative example.

Next, some modifications of the foregoing embodiment will be described below. With reference to FIGS. 8A and 8B, a description will be given below of a configuration example in which a terminal of an FPC substrate has some holes through which a user can check a solder joint.

FIG. 8A illustrates an example of a good solder joint between a first FPC terminal 611 and a first CoF terminal 612. It should be noted that FIG. 8A employs an X-Y-Z orthogonal coordinate system as in FIG. 2, for the sake of convenience.

FIG. 8A illustrates the solder joint as viewed from the first FPC terminal 611 side. The first FPC terminal 611 is provided with six holes: a first hole E1, a second hole E2, a third hole E3, a fourth hole E4, a fifth hole E5, and a sixth hole E6. Each of the first hole E1 to the sixth hole E6 is formed across the first FPC terminal 611 so as to be vertical to the surface of the first FPC terminal 611. FIG. 8A further illustrates a first contact region R21 in which the first FPC terminal 611 is in contact with the first CoF terminal 612.

In the example of FIG. 8A, the first hole E1, the second hole E2, and the third hole E3 are arranged within an upper area on the surface of the first FPC terminal 611 and positioned at substantially the same height. Moreover, the first hole E1, the second hole E2, and the third hole E3 are arranged in this order from the negative side to the positive side along the X-axis while being apart from each other. In the example of FIG. 8A, the fourth hole E4, the fifth hole E5, and the sixth hole E6 are arranged within a lower area on the surface of the first FPC terminal 611 and positioned at substantially the same height. Moreover, the fourth hole E4, the fifth hole E5, and the sixth hole E6 are arranged in this order from the negative side to the positive side along the X-axis while being apart from each other. In the example of FIG. 8A, the first hole E1 and the fourth hole E4 are arranged at substantially the same location in a direction parallel to the X-axis. Likewise, the second hole E2 and the fifth hole E5 are arranged at substantially the same location; the third hole E3 and the sixth hole E6 are arranged at substantially the same location. However, if a plurality of holes are formed in the first FPC terminal 611, these holes do not necessarily have to be arranged as in the example of FIG.

8A. In short, the holes do not have to be arranged at the same coordinates in a direction parallel to either the X-axis or the Z-axis.

Each of the first hole E1 to the sixth hole E6 corresponds to a section of the first FPC terminal 611 from which a conductive member such as a copper foil, a base member, and a cover member are removed. In this example, the portion of the first FPC terminal 611 which is surrounded by the first hole E1 to the sixth hole E6 is longer than the first CoF terminal 612 in a horizontal direction. In the example of FIG. 8A, the horizontal direction corresponds to a direction parallel to the X-axis.

In the example of FIG. 8A, the first CoF terminal 612 is in contact with the portion of the surface of the first FPC terminal 611 which contains both the second hole E2 and the fifth hole E5 as viewed from a direction parallel to the Y-axis. Furthermore, the first FPC terminal 611 is joined to the first CoF terminal 612 with second solder 621 therebetween. In the example of FIG. 8A, when the first FPC terminal 611 is viewed from its rear surface, the second solder 621 is viewable through both the second hole E2 and the fifth hole E5.

If the second solder 621 is sufficiently heated to melt the second solder 621, the second solder 621 appropriately expands and wets. In this case, the user can confirm that the first FPC terminal 611 is firmly joined to the first CoF terminal 612.

FIG. 8B illustrates an example of a poor solder joint between a first (a) FPC terminal 611a and a first (a) CoF terminal 612a according to a comparative example. It should be noted that FIG. 8B employs an X-Y-Z orthogonal coordinate system as in FIG. 2, for the sake of convenience.

FIG. 8B further illustrates a first (a) contact region R21a in which the first (a) FPC terminal 611a is in contact with the first (a) CoF terminal 612a. In the example of FIG. 8B, the first (a) FPC terminal 611a, the first (a) CoF terminal 612a, a first (a) hole E1a to a sixth (a) hole E6a, and second (a) solder 621a correspond, respectively, to the first FPC terminal 611, the first CoF terminal 612, the first hole E1 to the sixth hole E6, and the second solder 621 in the example of FIG. 8A. In the example of FIG. 8B, the second (a) solder 621a does not expand so widely, as compared to that of FIG. 8A.

In the example of FIG. 8B, when the first (a) FPC terminal 611a is viewed from its rear surface, the second (a) solder 621a is not viewable through either the second (a) hole E2a or the fifth (a) hole E5a. In this case, the second (a) solder 621a is insufficiently heated and thus fails to appropriately wet and expand, so that the first (a) FPC terminal 611a may be poorly joined to the first (a) CoF terminal 612a. As a result, the user can confirm that the first (a) FPC terminal 611a is poorly joined to the first (a) CoF terminal 612a.

As described above, a head unit includes: an FPC substrate having a terminal to be soldered to a CoF substrate; and the CoF substrate having a terminal to be soldered to the FPC substrate. The head unit is configured such that the terminals of the FPC substrate and the CoF substrate are soldered together while the terminals are facing each other.

In the head unit, the terminals of the FPC substrate and the CoF substrate are soldered together while the terminals are facing each other. In a printer 1 according to this modification, a component having a nonmetallic portion, such as that having a hole, is disposed above or below an FPC terminal. When solder sufficiently melts with heat, a user can view that the solder appropriately wets and widely expands, through the hole from the rear surface of an FPC terminal. In this way, he/she can confirm that the FPC substrate is firmly soldered to the CoF substrate. In some cases, the terminals of the FPC substrate and the CoF substrate may be somewhat shifted from each other. In consideration of such cases, a plurality of holes may be formed in the printer 1. Forming the holes can enhance the possibility of reliably checking the solder joint even when the terminals of the FPC substrate and the CoF substrate are shifted from each other.

In the printer 1 according to this modification, when the terminals of the FPC substrate and the CoF substrate are soldered together, a hole is formed at a predetermined location on the terminal of the FPC substrate. In this case, the terminal with the hole is formed on the FPC substrate, which is positioned closer to the user than the CoF substrate is when a user visually checks the solder joint. With the configuration in this modification, the user can visually check whether the solder bridges between terminals and whether the solder sufficiently expands.

The method by which the user visually checks the solder joint through the hole is not limited to a specific one. For example, the terminal of the CoF substrate and the solder having different colors are used. In which case, the user may confirm whether the solder joint is normal, depending on which color he/she can view through the hole. In this modification, the hole is formed in the portion of the terminal of the FPC substrate which is in contact with and larger than the terminal of the CoF substrate. Forming the hole in this manner enables the user to visually check the solder joint through the hole, which would otherwise be difficult to do.

In the head unit 101, as a configuration example, the hole is formed within the first contact region R21 of the second flexible substrate which is in contact with the first flexible substrate. In the example of FIG. 8A, each of the first hole E1 to the sixth hole E6 corresponds to an example of the hole; however, the head unit 101 does not necessarily have to be provided with such a hole.

Figure 9:
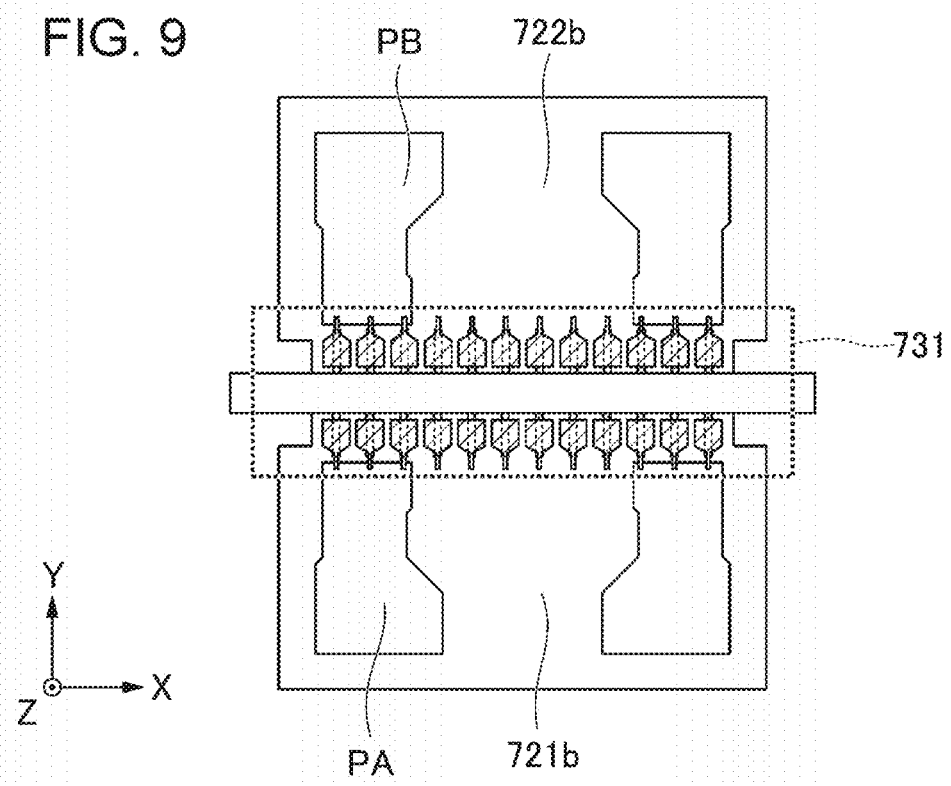
FIG. 9 schematically illustrates an example of FPC substrates and CoF substrates joined together, according to another modification of the embodiment.
Figure 10:
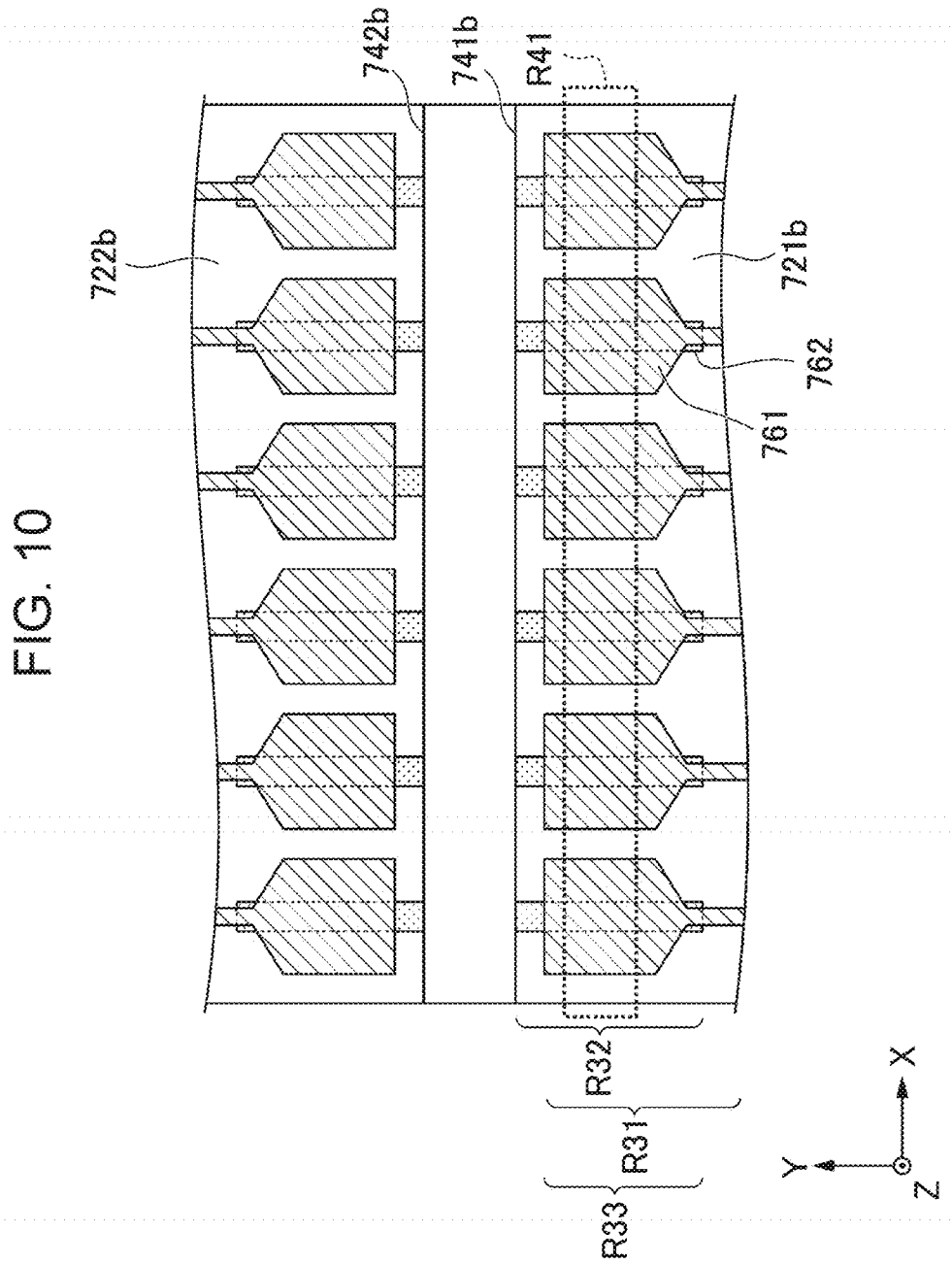
FIG. 10 schematically illustrates an example of the solder joints between the FPC substrates and the CoF substrates according to the modification of the embodiment.

Some other modifications will be described below. With reference to FIGS. 9 and 10, a description will be given below of a configuration example in which terminals of an FPC substrate and a CoF substrate are crimp-joined together. Since FIGS. 9 and 10 are each a schematic view, the arrangement and number of terminals in each drawing are examples and may be different from real ones accordingly.

FIG. 9 illustrates an example of FPC substrates and CoF substrates joined together, according to another modification of the foregoing embodiment. It should be noted that FIG. 9 employs an X-Y-Z orthogonal coordinate system as in FIG. 2, for the sake of convenience.

In the example of FIG. 9, a first (b) FPC substrate 721b and a second (b) FPC substrate 722b are arranged side by side with their front surfaces facing upward. A CoF substrate 731 is disposed adjacent to the opposing sides of the first (b) FPC substrate 721b and the second (b) FPC substrate 722b. The CoF substrate 731 includes: two CoF substrates; and two joints at which one of the CoF substrates is joined to the first (b) FPC substrate 721b and at which the remaining CoF substrate is joined to the second (b) FPC substrate 722b. In short, the CoF substrate 731 includes the joints at which the respective CoF substrates are joined to the first (b) FPC substrate 721b and the second (b) FPC substrate 722b. In the example of FIG. 9, the size, in a direction parallel to the Y-axis, of the area occupied by the CoF substrate 731 is an example and is not limited to a specific one accordingly. Alternatively, the size, in the direction parallel to the Y-axis, of the area occupied by the CoF substrate 731 may be large enough to contain the ends of the terminals of the CoF substrates.

FIG. 10 illustrates an example of the solder joints between the FPC substrates and the CoF substrates according to the modification of the embodiment. It should be noted that FIG. 10 employs an X-Y-Z orthogonal coordinate system as in FIG. 2, for the sake of convenience.

FIG. 10, which is related to the example of FIG. 9, illustrates a first CoF folded section 741b and a second CoF folded section 742b. The first CoF folded section 741b is a portion of the CoF substrate 731 in which the CoF substrate joined to the first (b) FPC substrate 721b is folded, whereas the second CoF folded section 742b is a portion of the CoF substrate 731 in which the CoF substrate joined to the second (b) FPC substrate 722b is folded.

FIG. 10 further illustrates an FPC region R31, a CoF region R32, and a second contact region R33 in both the first (b) FPC substrate 721b and the CoF substrate bonded thereto. The FPC region R31 is an area in which the first (b) FPC substrate 721b is disposed so as to extend in a direction parallel to the Y-axis; the CoF region R32 is an area in which the CoF substrate is disposed so as to extend in the direction parallel to the Y-axis; and the second contact region R33 is an area in which the first (b) FPC substrate 721b is in contact with the CoF substrate. In the example of FIG. 10, reference numeral 761 is assigned to a second FPC terminal, which is one of the FPC terminals related to one another within the second contact region R33, and reference numeral 762 is assigned to a second CoF terminal, which is one of the CoF terminals related to one another within the second contact region R33.

FIG. 10 further illustrates a heat tool application region R41 in which a heat tool heats to join together both the first (b) FPC substrate 721b and the CoF substrate. The heat tool application region R41 contains a portion or whole of the second contact region R33. In the example of FIG. 10, the heat tool application region R41 contains at least an area to be soldered, which corresponds to a portion of the second contact region R33. As an alternative example, however, the heat tool application region R41 may contain the entire second contact region R33 and have a larger area.

The configurations of the second (b) FPC substrate 722b and the CoF substrate bonded thereto are substantially the same as the foregoing configurations of the first (b) FPC substrate 721b and the CoF substrate bonded thereto.

In FIG. 9, reference characters PA and PB are assigned to components in the first (b) FPC substrate 721b and the second (b) FPC substrate 722b, for the sake of convenience. In the following description, the component denoted by PA is referred to as the PA line, whereas the component denoted by PB is referred to as the PB line. In this example, the PB line and the PA line are processed in this order. More specifically, a heat tool is first moved downward between the PA line and the PB line of the CoF substrates disposed in an upright position. The CoF having the PB line is then moved over the FPC bonding pad while being drawn and guided. The heat tool is moved downward to the FPC bonding pad and then heats the FPC bonding pad while placing a load thereon. After the FPC bonding pad has been cooled down, the heat tool is moved upward.

In this example, as described above, the crimp-joining process is performed to press the heat tool against the contact between the terminals of the FPC substrates and the terminals of the CoF substrates while the terminals of the CoF substrates are folded. In this case, each of the FPC substrates and the CoF substrates may be a flexible substrate, so that the terminals can be soldered together. In this example, after the FPC substrates have been soldered to the respective folded CoF substrates in the above manner, the two FPC substrates, or the first (b) FPC substrate 721b and the second (b) FPC substrate 722b, are erected on the upper surface of the case head. Each CoF substrate is thereby returned to its original shape, so that each CoF substrate is made straight.

As a configuration example, in the head unit 101, both the first flexible substrate and the second flexible substrate are folded and crimp-bonded together. In the head unit 101, however, both the first flexible substrate and the second flexible substrate do not necessarily have to be crimp-bonded together as in the manner illustrated FIGS. 9 and 10.

Although the embodiment and the modifications have been described in detail with reference to the accompanying drawings, the specific configuration of the present disclosure is not limited to them. For example, a design devised without departing from the spirit of the present disclosure falls within the scope of the claims.

Supplementary Note

Aspect 1

A head unit to be mounted in a liquid ejecting apparatus, including:
  a liquid ejecting section that includes a pressure chamber that stores ink, a plurality of nozzles that communicate with the pressure chamber, and a supply passage through which the ink is to be supplied to the pressure chamber;
  a piezoelectric element that varies a capacity of the pressure chamber in response to an electrical signal;
  a drive signal control circuit that selectively supplies the electrical signal to the piezoelectric element;
  a first flexible substrate that transmits the electrical signal to a joining terminal of the piezoelectric element; and
  a second flexible substrate that transmits the electrical signal to the first flexible substrate, wherein
  the second flexible substrate has a cover member, a conductive member, and a base member,
  the second flexible substrate includes a first region and a second region, the first region having a stack of the cover member, the conductive member, and the base member, the second region having a stack of the conductive member and the base member, and
  the second flexible substrate has a surface on which a terminal is disposed within the second region, the terminal being joined to the first flexible substrate with solder.

Aspect 2

The head unit according to aspect 1, wherein
  no other conductive members are disposed on an upper surface of the conductive member joined to the solder within the second region.

Aspect 3

The head unit according to aspect 1 or 2, wherein
  the first flexible substrate and the second flexible substrate are double-sided wiring substrates.

Aspect 4

The head unit according to one of aspects 1 to 3, wherein the first flexible substrate and the second flexible substrate are folded and crimp-bonded together.

Aspect 5

The head unit according to one of aspects 1 to 4, wherein the ink is reactive ink.

Aspect 6

The head unit according to one of aspects 1 to 5, wherein the plurality of nozzles are arranged at a high density.

Aspect 7

The head unit according to one of aspects 1 to 6, wherein the second flexible substrate has a first contact region in which a hole is formed, the first contact region being in contact with the first flexible substrate.

Aspect 8

A liquid ejecting apparatus including:
a transport mechanism; and
a head unit, the head unit including
   a liquid ejecting section that includes a pressure chamber that stores ink, a plurality of nozzles that communicate with the pressure chamber, and a supply passage through which the ink is to be supplied to the pressure chamber,
   a piezoelectric element that varies a capacity of the pressure chamber in response to an electrical signal,
   a drive signal control circuit that selectively supplies the electrical signal to the piezoelectric element,
   a first flexible substrate that transmits the electrical signal to a joining terminal of the piezoelectric element, and
   a second flexible substrate that transmits the electrical signal to the first flexible substrate, wherein
the second flexible substrate has a cover member, a conductive member, and a base member,
the second flexible substrate includes a first region and a second region, the first region having a stack of the cover member, the conductive member, and the base member, the second region having a stack of the conductive member and the base member, and
the second flexible substrate has a surface on which a terminal is disposed within the second region, the terminal being joined to the first flexible substrate with solder.

What is claimed is:
1. A head unit to be mounted in a liquid ejecting apparatus, comprising:
   a liquid ejecting section that includes a pressure chamber that stores ink, a plurality of nozzles that communicate with the pressure chamber, and a supply passage through which the ink is to be supplied to the pressure chamber;
   a piezoelectric element that varies a capacity of the pressure chamber in response to an electrical signal;
   a drive signal control circuit that selectively supplies the electrical signal to the piezoelectric element;
   a first flexible substrate that transmits the electrical signal to a joining terminal of the piezoelectric element; and
   a second flexible substrate that transmits the electrical signal to the first flexible substrate, wherein
the second flexible substrate has a cover member, a conductive member, and a base member,
the second flexible substrate includes a first region and a second region, the first region having a stack of the cover member, the conductive member, and the base member, the second region having a stack of the conductive member and the base member, and
the second flexible substrate has a surface on which a terminal is disposed within the second region, the terminal being joined to the first flexible substrate with solder.

2. The head unit according to claim 1, wherein
no other conductive members are disposed on an upper surface of the conductive member joined to the solder within the second region.

3. The head unit according to claim 2, wherein
the first flexible substrate and the second flexible substrate are double-sided wiring substrates.

4. The head unit according to claim 3, wherein
the first flexible substrate and the second flexible substrate are folded and crimp-bonded together.

5. The head unit according to claim 4, wherein
the ink is reactive ink.

6. The head unit according to claim 5, wherein
the plurality of nozzles are arranged at a high density.

7. The head unit according to claim 1, wherein
the second flexible substrate has a first contact region in which a hole is formed, the first contact region being in contact with the first flexible substrate.

8. A liquid ejecting apparatus comprising:
a transport mechanism; and
a head unit, the head unit including
   a liquid ejecting section that includes a pressure chamber that stores ink, a plurality of nozzles that communicate with the pressure chamber, and a supply passage through which the ink is to be supplied to the pressure chamber,
   a piezoelectric element that varies a capacity of the pressure chamber in response to an electrical signal,
   a drive signal control circuit that selectively supplies the electrical signal to the piezoelectric element,
   a first flexible substrate that transmits the electrical signal to a joining terminal of the piezoelectric element, and
   a second flexible substrate that transmits the electrical signal to the first flexible substrate, wherein
the second flexible substrate has a cover member, a conductive member, and a base member,
the second flexible substrate includes a first region and a second region, the first region having a stack of the cover member, the conductive member, and the base member, the second region having a stack of the conductive member and the base member, and
the second flexible substrate has a surface on which a terminal is disposed within the second region, the terminal being joined to the first flexible substrate with solder.

* * * * *